United States Patent
Li et al.

(10) Patent No.: US 7,053,001 B2
(45) Date of Patent: May 30, 2006

(54) SELECTIVE ETCHING PROCESSES FOR $IN_2O_3$ THIN FILMS IN FERAM DEVICE APPLICATIONS

(75) Inventors: Tingkai Li, Vancouver, WA (US);
Sheng Teng Hsu, Camas, WA (US);
Bruce Dale Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 288 days.

(21) Appl. No.: 10/676,983

(22) Filed: Sep. 30, 2003

(65) Prior Publication Data
US 2005/0070114 A1   Mar. 31, 2005

(51) Int. Cl.
*H01I 21/302* (2006.01)
(52) U.S. Cl. ............ 438/710; 240/706; 240/720
(58) Field of Classification Search ........ 438/706, 438/710, 720, 244, 253, 239, 240
See application file for complete search history.

(56) References Cited

U.S. PATENT DOCUMENTS

| | | | |
|---|---|---|---|
| 6,407,422 B1 * | 6/2002 | Asano et al. | 257/306 |
| 6,613,679 B1 * | 9/2003 | Chino | 438/700 |

* cited by examiner

*Primary Examiner*—Lan Vinh
(74) *Attorney, Agent, or Firm*—Robert D. Varitz, P.C.

(57) ABSTRACT

A method of selective etching a metal oxide layer for fabrication of a ferroelectric device includes preparing a silicon substrate, including forming an oxide layer thereon; depositing a layer of metal or metal oxide thin film on the substrate; patterning and selectively etching the metal or metal oxide thin film without substantially over etching into the underlying oxide layer; depositing a layer of ferroelectric material; depositing a top electrode on the ferroelectric material; and completing the ferroelectric device.

14 Claims, 4 Drawing Sheets

SELECTIVE ETCHING PROCESSES FOR $In_2O_3$ THIN FILMS IN FERAM DEVICE APPLICATIONS

FIELD OF THE INVENTION

This invention relates to ferroelectric memory device structures and integrated processes for ferroelectric non-volatile memory devices, and specifically to a method of selective etching without over etching an oxide layer.

BACKGROUND OF THE INVENTION

Metal/FE/$In_2O_3$/Si or Metal/FE/oxide/$In_2O_3$/Si memory cells for one-transistor ferroelectric memory devices are desirable because they have extended memory retention. For integration processes of $In_2O_3$ FeRAM memory devices and high-density applications, a selective etching process is a critical issue,

SUMMARY OF THE INVENTION

A method of selective etching a metal oxide layer for fabrication of a ferroelectric device includes preparing a silicon substrate, including forming an oxide layer thereon; depositing a layer of metal or metal oxide thin film on the substrate; patterning and selectively etching the metal or metal oxide thin film without substantially over etching into the underlying oxide layer; depositing a layer of ferroelectric material; depositing a top electrode on the ferroelectric material; and completing the ferroelectric device.

It is an object of the invention to provide a method of selective etching of $In_2O_3$ thin films for Metal/FE/$In_2O_3$/Si or Metal/FE/$In_2O_3$/$SiO_2$ or high-k oxide/Si FeRAM ferroelectric memory devices.

Another object of the invention is to selective etch a layer without over etching an adjacent oxide layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

This invention is a method of selective etching an indium-containing layer, such as $In_2O_3$, which is particularly suitable for MFMox (Metal-Ferroelectric-Metal oxide) FeRAM fabrication, wherein $In_2O_3$ or other indium-containing layers are used as a bottom electrode for a ferroelectric stack. The method of the invention may also be used for fabrication of other device types.

The examples presented herein are described in the context of selective etching processes of $In_2O_3$ thin films as used in Metal/FE/$In_2O_3$/Si, Metal/FE/$In_2O_3$/$SiO_2$, or high-k oxide on silicon FeRAM ferroelectric memory device. In order to fabricate a Metal/FE/$In_2O_3$/Si, Metal/FE/$In_2O_3$/$SiO_2$, or high-k oxide on silicon FeRAM ferroelectric memory devices, it is necessary to pattern and etch $In_2O_3$ thin film, while at most, minimally over etching into a $SiO_2$ layer.

The method of the invention is an etching process for patterning and etching $In_2O_3$ without excessive over etching of a $SiO_2$ layer. The etching rates for In, $In_2O_3$, $SiO_2$ thin films are: In: 100 nm/min; $In_2O_3$: 80 nm/min; and $SiO_2$: 60 nm/min. The chemistry and etching conditions of the method of the invention are as follows: BCl 30 sccm; Cl 60 sccm; Tcp RF 350 W; Bias RF 150 W; Pressure 6 torr.

The substrate used to form Lead Germanium Oxide ($Pb_5Ge_3O_{11}$) (PGO) MFS devices is, in the preferred embodiment, a P-type silicon wafer. Two processes may be followed according to the method of the invention; the first includes a deposition of indium, while the second includes a deposition of indium oxide.

Figure 1:
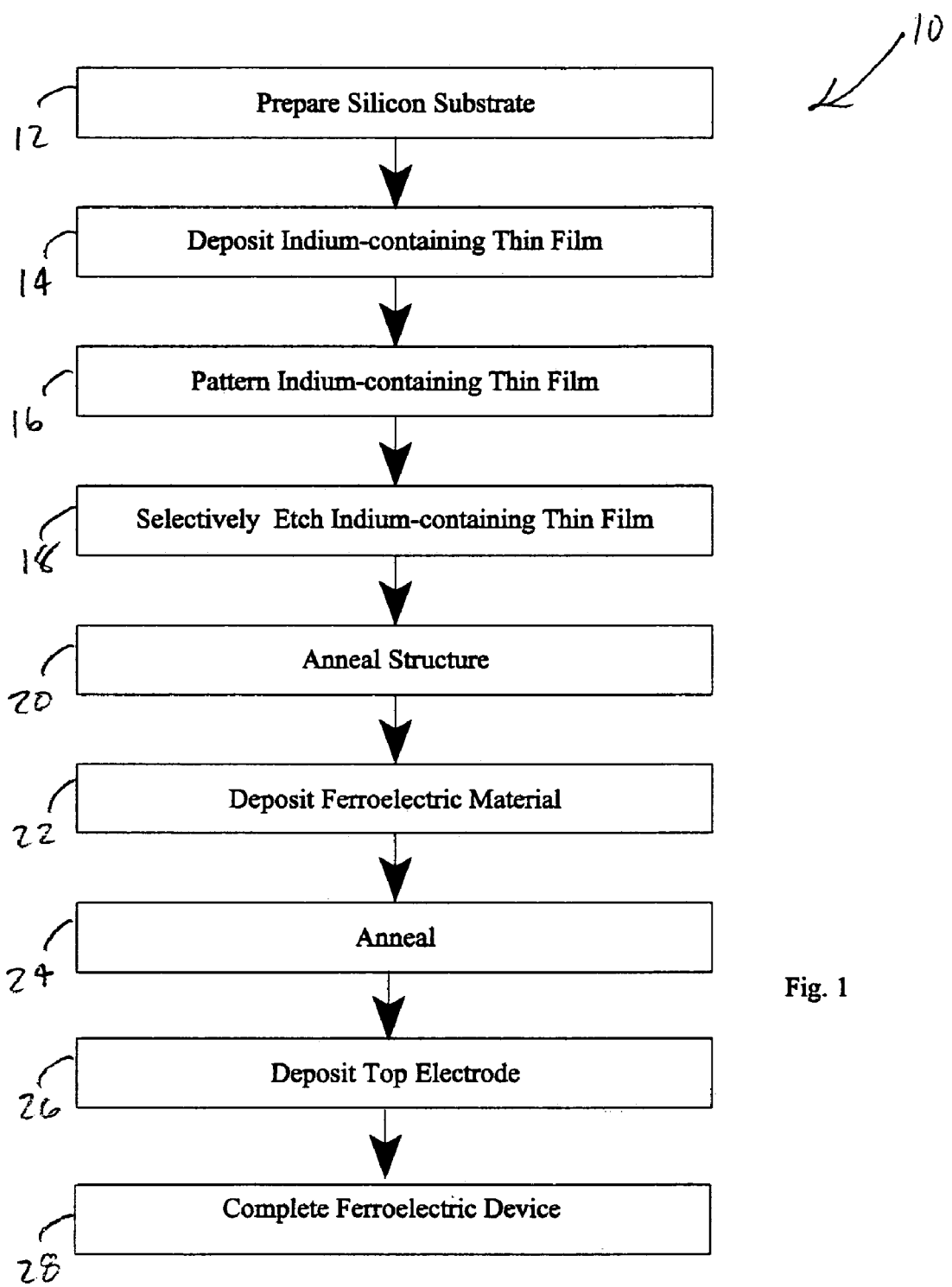
FIG. 1 is a block diagram of a first embodiment of the method of the invention.

Process One:

Referring now to FIG. 1, wherein the first embodiment of the method of the invention is depicted generally at 10, a silicon wafer is prepared, block 12. Wafer preparation may include formation of an oxide layer on the silicon substrate. The oxide may be silicon oxide or a high-k oxide formed on the silicon substrate. A thin film of indium is deposited on the silicon, $SiO_2$, or high-k oxide on silicon substrate, block 14, depending on thickness measurements.

P type silicon (100) wafers are used as the substrates for $In_2O_3$ thin film deposition. For a $In_2O_3$ thin film deposited on silicon, the silicon wafer is dipped in HF (50:1) for 5 seconds prior to deposition of the $In_2O_3$ thin film. For a $In_2O_3$ thin film deposited on $SiO_2$, the silicon wafer has $SiO_2$ layer deposited by CVD, which $SiO_2$ layer has a thickness of about 200 nm prior to deposition of $In_2O_3$. DC sputtering is used to deposit a indium-containing layer using an indium target. Deposition of a $In_2O_3$ thin film including depositing the thin film on a substrate at a deposition temperature of between about 20° C. to 300° C.; at a pressure of between about 1 torr to 10 torr; at an oxygen partial pressure of between about 0% to 60%, depending on which films, e.g., indium or $InO_x$, is to be deposited. The DC sputtering power is set to between about 200 W to 300 W, and the backward power is maintained to be smaller than 1%. The substrate temperatures is maintained at between about 20° C. to 200° C. After deposition of an $InO_x$ thin films, the post-annealing step is performed at a temperature of between about 400° C. to 800° C. for between about 5 minutes to 60 minutes in an oxygen atmosphere. The parameters are varied according to the desired resistance requirements of the memory device being fabricated according to the method of the invention.

The indium thin film is patterned, block 16, using a the selective etching process of the method of the invention. The following etching process is used for patterning and etching $In_2O_3$ without excessively over etching an underlying $SiO_2$ layer, block 18. The $In_2O_3$ thin film, which is deposited on a $SiO_2$ layer, is coated with photoresist, and patterned by photolithography, and developed. After the patterned $In_2O_3$ thin film is placed in an etching chamber, the chamber pressure is maintained in a range of between about 3 mtorr. to 15 mtorr, with the best results being obtained at a pressure of about 6 mtorr. Etching chemicals, including BCl, delivered at a flow rate of between about 10 sccm to 60 sccm, with the best results being obtained at a flow rate of about 30 sccm, and Cl with a flow rate of between about 20 sccm to 100 sccm, with the best results being obtained at a flow rate of about 60 sccm, are delivered into the etching chamber. The Tcp RF plasma of about 350 W and a Bias RF plasma of about 150 W is generated, keeping the backward plasma smaller than 1%. Depending on the thickness of the $In_2O_3$ film, and the etching rates listed on Table 2, the etching time is controlled to avoid over etching. This is because In and $In_2O_3$ each have a higher etching rate than does $SiO_2$ when the etching method of the invention is used.

TABLE 1

Chemistry and Etching Parameters

| Items | BCl (sccm) | Cl (sccm) | Tcp RF (W) | Bias RF (W) | Pressure (mtorr) |
|---|---|---|---|---|---|
| Parameters | 30 | 60 | 350 | 150 | 6 |

TABLE 2

Etching Rates for In, $In_2O_3$ and $SiO_2$ Thin Films

| Items | In | $In_2O_3$ | $SiO_2$ |
|---|---|---|---|
| Etching rates (nm/minute) | 100 | 80 | 60 |

The patterned indium thin film is annealed, block 20, depending on the resistivity requirements of the $In_2O_3$ thin film device application, in an oxygen atmosphere to form an indium oxide ($In_2O_3$) thin film from the indium layer, at a temperature of between about 400° C. to 800° C. for between about 5 minutes to 30 minutes at between about 500 torr. to 700 torr. After annealing, a layer of ferroelectric material is deposited on the indium-containing layer, block 22, the structure is again annealed, block 24. A top electrode, e.g., platinum, iridium aluminum-copper or aluminum, is deposited, block 26, and the ferroelectric device completed, block 28.

Figure 2:
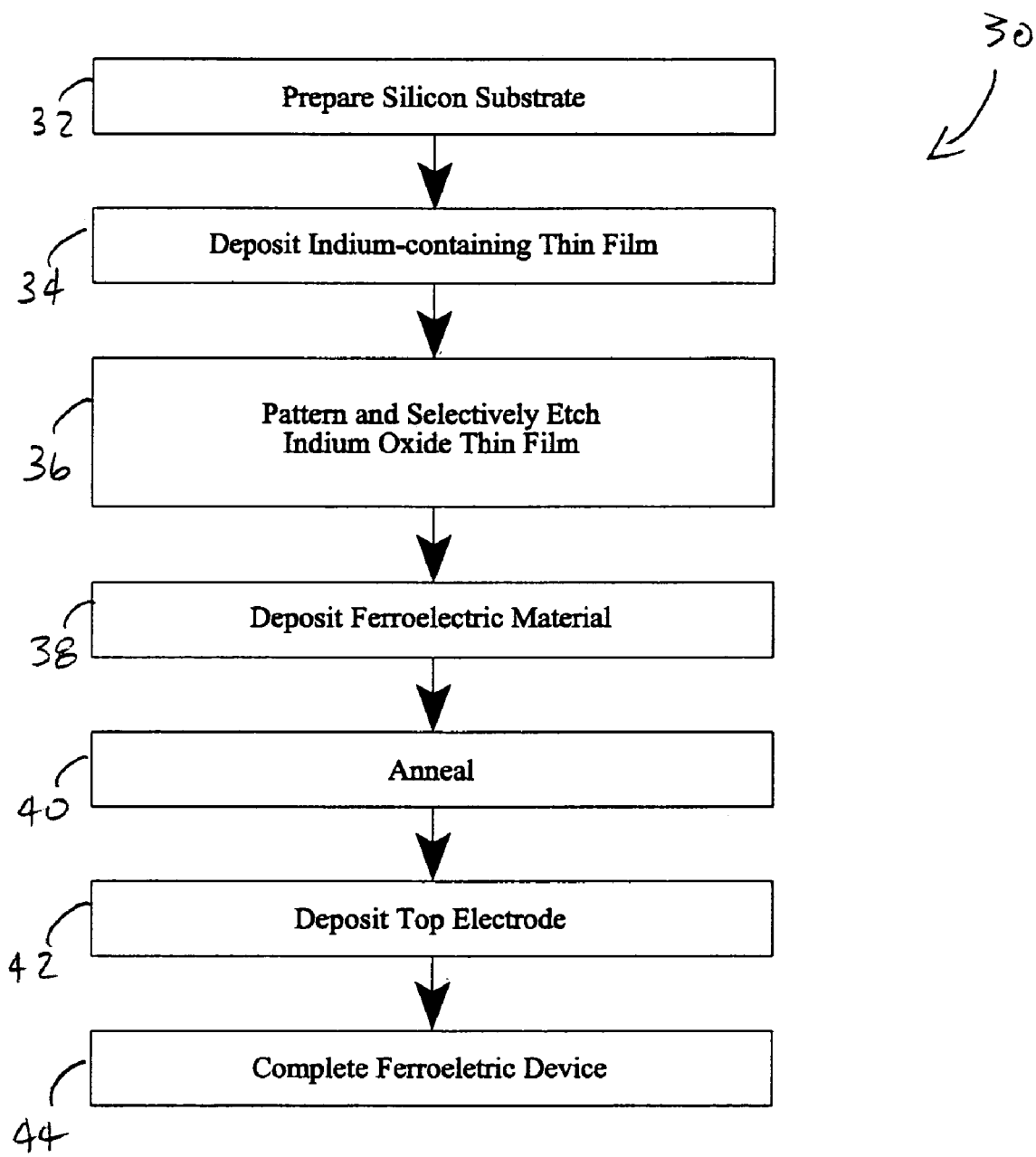
FIG. 2 is a block diagram of a second embodiment of the method of the invention.

Process Two:

Referring now to FIG. 2, a second embodiment of the method of the invention is depicted generally at 30, a silicon wafer is prepared, block 32. Wafer preparation may include formation of an oxide layer on the silicon substrate. The oxide may be silicon oxide or a high-k oxide formed on the silicon substrate. A thin film of indium oxide is deposited on the silicon, $SiO_2$, or high-k oxide on silicon substrate, block 34, depending on the thin film thickness. The indium oxide thin film is patterned and etched, block 36, using the selective etching process of the method of the invention, previously described.

A layer of ferroelectric material is deposited on the indium-containing layer, block 38, the structure is annealed, block 40. A top electrode, e.g., platinum, iridium aluminum-copper or aluminum, is deposited, block 42, and the ferroelectric device completed, block 44.

Figure 3:
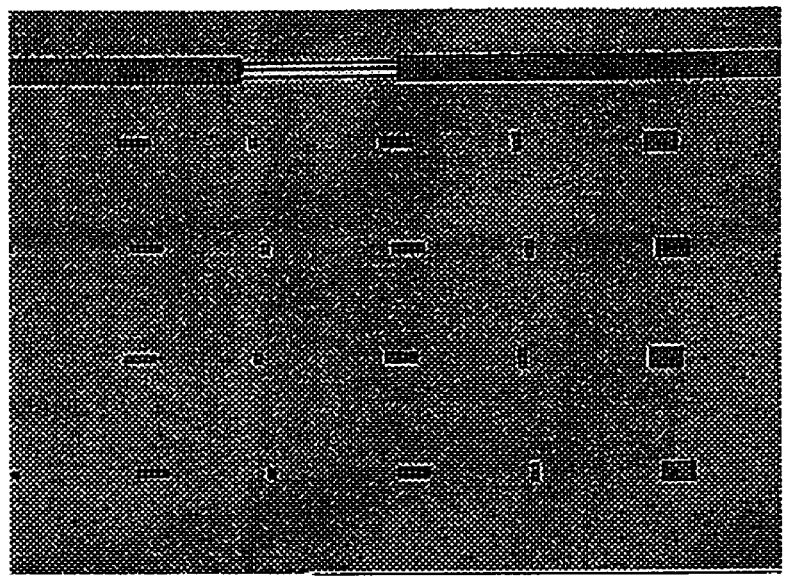
FIGS. 3 and 4 depict patterned and etched indium-containing thin films.
Figure 4:
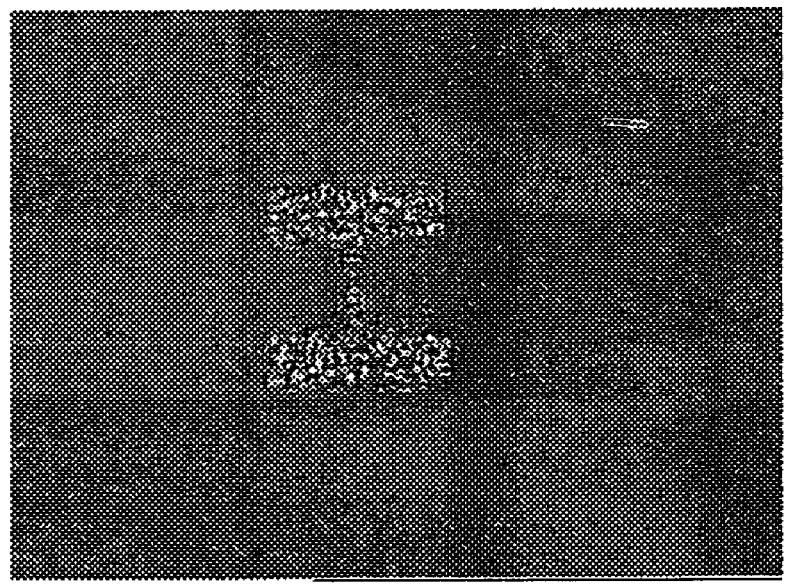

FIGS. 3 and 4 depict examples of patterned and etched indium thin films. Measurements of the $SiO_2$ thickness demonstrate only a 10 nm $SiO_2$ over etch, which meets the criteria for fabrication of FeRAM devices. FIG. 3 depicts a pN pattern for larger device, e.g., between about 10 μm×10 μm to 50 μm×100 μm, and FIG. 4 depicts a PN pattern for smaller device, e.g. <1 μm×1.5 μm. The selective patterning/etching method of the invention has been used successfully to pattern and etch indium and $InO_x$ thin films having devices sizes of between about 0.1 μm and 100 μm.

Figure 5:
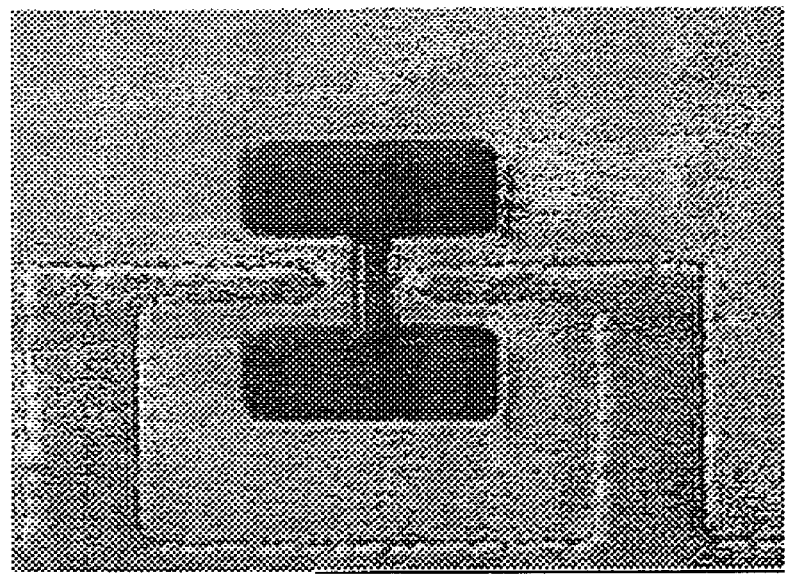
FIGS. 5 and 6 depicts patterned and etched $In_2O_3$ thin films.
Figure 6:
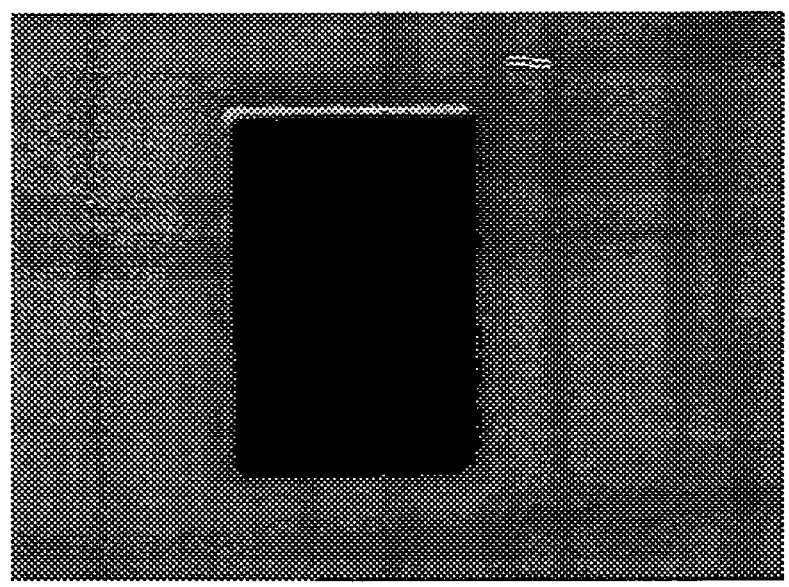

The method of the invention to etch $In_2O_3$ thin film does not require an endpoint detector. The method of the invention provides a method of etching $In_2O_3$ thin films with less than 25 nm $SiO_2$ over etch. FIGS. 5 and 6 depicts the patterned and etched $In_2O_3$ thin film, again, for smaller and larger devices, respectively. The $SiO_2$ thickness decreases from 214.7 nm to 193.8 nm., which represents about a 20 nm $SiO_2$ over etch. These results also meeting the criteria for fabrication of FeRAM devices.

Thus, a method for selective etching processes for $In_2O_3$ thin films in FeRAM device applications has been disclosed. It will be appreciated that further variations and modifications thereof may be made within the scope of the invention as defined in the appended claims.

We claim:

1. A method of selective etching a metal oxide layer for fabrication of a ferroelectric device, comprising:

preparing a silicon substrate;

depositing a layer of metal thin film on the substrate;

patterning and selectively etching the metal thin film without substantially over etching into an adjacent oxide layer, including etching the metal thin film using BCl and Cl gas in an etching chamber, wherein the etching chamber pressure is maintained at a pressure of about 6 mtorr; and wherein BCl is delivered at a flow rate of about 30 sccm, and Cl is delivered at a flow rate of about 60 sccm;

depositing a layer of ferroelectric material;

depositing a top electrode on the ferroelectric material; and completing the ferroelectric device.

2. The method of claim 1 wherein said preparing includes forming an oxide layer on the silicon substrate.

3. The method of claim 1 wherein said preparing includes forming a high-k oxide on the silicon substrate.

4. The method of claim 1 wherein said depositing a layer of metal thin film on the substrate include depositing a layer of material taken from the group of material consisting of indium and indium oxide.

5. The method of claim 1 wherein said patterning and selective etching the metal thin film further includes providing a Tcp RF of about 350 W at a Bias RF of about 150 W at a pressure of about 6 torr.

6. The method of claim 1 wherein said patterning and selectively etching includes coating the metal thin film with photoresist; patterning the photoresist by photolithography; placing the patterned structure in an etching chamber; maintaining the chamber pressure in a range of between about 3 mtorr. to 15 mtorr; etching the exposed metal thin film with etching chemicals consisting of BCl, delivered at a flow rate of between about 10 sccm to 60 sccm, and Cl with a flow rate of between about 20 sccm to 100 sccm; and generating a Tcp RF plasma of about 350 W and a Bias RF plasma of about 150 W, while maintaining the backward plasma less than 1%.

7. A method of selective etching a metal oxide layer for fabrication of a ferroelectric device, comprising:

preparing a silicon substrate;

depositing a layer of metal thin film on the substrate including depositing a layer of material taken from the group of material consisting of indium and indium oxide;

patterning the metal thin film;

selectively etching the metal thin film without substantially over etching into an adjacent oxide layer including etching the metal thin film using BCl and Cl gas in an etching chamber, including providing a Tcp RF of about 350 W at a Bias RF of about 150 W at a pressure of about 6 torr.;

depositing a ferroelectric material;

depositing a top electrode; and completing the ferroelectric device.

8. The method of claim 7 wherein the etching chamber pressure is maintained at a pressure of about 6 mtorr; and wherein BCl is delivered at a flow rate of about 30 sccm, and Cl is delivered at a flow rate of about 60 sccm, providing a gas volume of Cl which is twice that of BCl.

9. The method of claim 7 wherein said patterning and selectively etching includes coating the metal thin film with photoresist; patterning the photoresist by photolithography; placing the patterned structure in an etching chamber; maintaining the chamber pressure in a range of between about 3 mtorr. to 15 mtorr; etching the exposed metal thin film with etching chemicals consisting of BCl, delivered at a flow rate of between about 10 sccm to 60 sccm, and Cl with a flow rate of between about 20 sccm to 100 sccm; and generating a Tcp RF plasma of about 350 W and a Bias RF plasma of about 150 W, while maintaining the backward plasma less than 1%.

10. The method of claim 7 wherein said preparing includes forming an oxide layer on the silicon substrate.

11. The method of claim 10 wherein said forming an oxide layer includes forming a high-k oxide on the silicon substrate.

12. A method of selective etching a metal oxide layer for fabrication of a ferroelectric device, comprising:

preparing a silicon substrate, including forming an oxide layer on the silicon substrate;

depositing a layer of metal thin film on the substrate including depositing a layer of material taken from the group of material consisting of indium and indium oxide;

patterning the metal thin film;

selectively etching the metal thin film without substantially over etching into an adjacent oxide layer includes coating the metal thin film with photoresist; patterning the photoresist by photolithography; placing the patterned structure in an etching chamber; maintaining the chamber pressure in a range of between about 3 mtorr. to 15 mtorr; etching the exposed metal thin film with etching chemicals consisting of BCl, delivered at a flow rate of between about 10 sccm to 60 sccm, and Cl with a flow rate of between about 20 sccm to 100 sccm. wherein the volume of Cl is twice that of BCl; and generating a Tcp RF plasma of about 350 W and a Bias RF plasma of about 150 W, while maintaining the backward plasma less than 1%;

depositing a ferroelectric material;

depositing a top electrode; and completing the ferroelectric device.

13. The method of claim 12 wherein said forming an oxide layer includes forming a high-k oxide on the silicon substrate.

14. The method of claim 12 wherein the etching chamber pressure is maintained at a pressure of about 6 mtorr; and wherein BCl is delivered at a flow rate of about 30 sccm, and Cl is delivered at a flow rate of about 60 sccm.

* * * * *

UNITED STATES PATENT AND TRADEMARK OFFICE
CERTIFICATE OF CORRECTION

| | |
|---|---|
| PATENT NO. | : 7,053,001 B2 |
| APPLICATION NO. | : 10/676983 |
| DATED | : May 30, 2006 |
| INVENTOR(S) | : Tingkai Li et al. |

Page 1 of 1

It is certified that error appears in the above-identified patent and that said Letters Patent is hereby corrected as shown below:

Column 5, line 29 insert the following:

15.     The method of claim 7 wherein the etching chamber pressure is maintained at a pressure of about 6 mtorr; and wherein BCl is delivered at a flow rate of about 30 sccm, and Cl is delivered at a flow rate of about 60 sccm, providing a gas volume of Cl which is twice that of BCl.

Signed and Sealed this

Nineteenth Day of February, 2008

JON W. DUDAS
*Director of the United States Patent and Trademark Office*